(12) United States Patent
Yamamoto et al.

(10) Patent No.: US 9,793,895 B2
(45) Date of Patent: Oct. 17, 2017

(54) ELECTRONIC CIRCUIT, LATCH CIRCUIT, AND EXTERNAL ACTION DETECTING CIRCUIT

(71) Applicant: FUJITSU LIMITED, Kawasaki-shi, Kanagawa (JP)

(72) Inventors: Dai Yamamoto, Kawasaki (JP); Naoya Torii, Hachioji (JP); Ikuya Morikawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/376,208

(22) Filed: Dec. 12, 2016

(65) Prior Publication Data

US 2017/0187381 A1    Jun. 29, 2017

(30) Foreign Application Priority Data

Dec. 28, 2015 (JP) .................. 2015-257075

(51) Int. Cl.
| | | |
|---|---|---|
| *H03K 19/00* | (2006.01) | |
| *H03K 19/003* | (2006.01) | |
| *G06F 1/08* | (2006.01) | |
| *G06F 21/55* | (2013.01) | |
| *H03K 3/84* | (2006.01) | |
| *H03K 19/20* | (2006.01) | |
| *G06F 21/75* | (2013.01) | |

(52) U.S. Cl.
CPC ......... *H03K 19/00323* (2013.01); *G06F 1/08* (2013.01); *G06F 21/558* (2013.01); *G06F 21/75* (2013.01); *H03K 3/84* (2013.01); *H03K 19/20* (2013.01)

(58) Field of Classification Search
CPC .... H03K 19/00323; H03K 3/84; H03K 19/20; G06F 21/558; G06F 1/08
USPC .................................. 326/8; 726/26; 714/746
See application file for complete search history.

(56) References Cited

U.S. PATENT DOCUMENTS

| | | | |
|---|---|---|---|
| 5,117,457 A | 5/1992 | Comerford et al. | |
| 7,941,715 B2 * | 5/2011 | Casarsa ............ | G01R 31/31854 326/16 |
| 8,334,707 B2 * | 12/2012 | Kuenemund ............ | G11C 7/24 326/46 |
| 2001/0033012 A1 | 10/2001 | Koemmerling et al. | |

FOREIGN PATENT DOCUMENTS

| | | |
|---|---|---|
| EP | 0268882 | 6/1988 |
| JP | 63-124153 | 5/1988 |
| JP | 02-228725 | 9/1990 |
| JP | 2003-519852 | 6/2003 |

* cited by examiner

*Primary Examiner* — Daniel D Chang
(74) *Attorney, Agent, or Firm* — Fujitsu Patent Center (57) ABSTRACT

An electronic circuit includes: a first logic circuit coupled to a first input line and a first output line; a second logic circuit coupled to a second input line and a second output line; a first line pattern coupled to the first output line and including an input line different from the second input line; and a second line pattern coupled to the second output line and different from the first input line, wherein at least a part of the first output line, the first line pattern, the second output line, or the second line pattern has a folded shape or a circular shape.

13 Claims, 8 Drawing Sheets

| LATCH OUTPUT VALUE | | NUMBER OF LATCHES MEASURED | DETAILS OF CHANGE |
|---|---|---|---|
| BEFORE FIB PROCESSING | AFTER FIB PROCESSING | | |
| 0 | 0 | 2 | CHANGED OR NOT CHANGED |
| | 1 | 2 | |
| 1 | 0 | 4 | CHANGED TO 0 |
| RANDOM NUMBER | 0 | 2 | CHANGED TO NON-RANDOM NUMBER |
| | 1 | 2 | |

ELECTRONIC CIRCUIT, LATCH CIRCUIT, AND EXTERNAL ACTION DETECTING CIRCUIT

CROSS-REFERENCE TO RELATED APPLICATION

This application is based upon and claims the benefit of priority of the prior Japanese Patent Application No. 2015-257075, filed on Dec. 28, 2015, the entire contents of which are incorporated herein by reference.

FIELD

The embodiments discussed herein are related to an electronic circuit, a latch circuit, and an external action detecting circuit.

BACKGROUND

Since the counterfeit products of various products such as batteries and cartridges of game machines are manufactured using an analysis result of an integrated circuit (IC) chip which is present in each regular product, an authentication function is provided so as to prevent the analysis of the IC chip.

Related technologies are disclosed in, for example, Japanese Laid-open Patent Publication No. 63-124153.

SUMMARY

According to one aspect of the embodiments, an electronic circuit includes: a first logic circuit coupled to a first input line and a first output line; a second logic circuit coupled to a second input line and a second output line; a first line pattern coupled to the first output line and including an input line different from the second input line; and a second line pattern coupled to the second output line and different from the first input line, wherein at least a part of the first output line, the first line pattern, the second output line, or the second line pattern has a folded shape or a circular shape.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In an effort to implement the authentication function, an encryption process may be performed based on secret information for guaranteeing a regular product. For example, the secret information is recorded on a nonvolatile memory in an IC chip.

When the secret information is stored in a nonvolatile memory, the secret information may be read by an attack from the outside. A probe attack which is called an invasive attack, a short circuit by a focused ion beam (FIB), or the like may be used as an attack means.

An example of a countermeasure against the invasive attack is a protection using a shield circuit. In the shield circuit, since lines called shield lines in the uppermost layer of the chip are densely arranged, it may be difficult to make an invasive attack into a chip without cutting off the lines.

In the shield circuit, a constant current flows in each shield line. When a line is cut off, the current at the end of the released shield line becomes zero (0). Accordingly, the shield circuit determines that an invasive attack into the chip has been made, and removes the secret information stored in the nonvolatile memory.

For example, in the case where the shield circuit is used, when an attacker forms a state in which the cut-off shield line is coupled to an electrical wire having a constant potential (a short circuit of a line), the cut-off may not be detected. Since a hole is formed through the shield line forming a shield in the uppermost layer after this state is formed, the attacker may make the probe attack through the hole.

Figure 1:
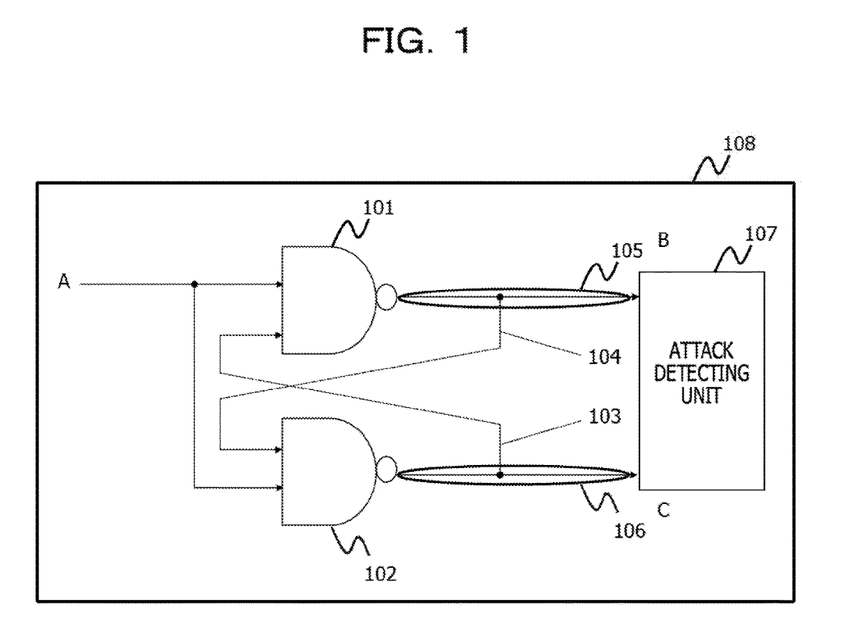
FIG. 1 is a diagram illustrating an example of an attack detecting circuit.

FIG. 1 illustrates an example of an attack detecting circuit. In FIG. 1, a configuration of an attack detecting circuit using an RS latch (SR latch) circuit is illustrated. As illustrated in FIG. 1, the attack detecting circuit includes two NAND circuits 101 and 102, and an input value A is input to each of the NAND circuits 101 and 102. An output value of the NAND circuit 102 is input to the NAND circuit 101 via an output line 103. An output value of the NAND circuit 101 is input to the NAND circuit 102 via an output line 104. The NAND circuits 101 and 102 output a NAND operation result based on the above-mentioned two inputs. The attack detecting circuit includes output lines 105 and 106 coupled to respective output terminals of the NAND circuits 101 and 102. One or all of the output lines 103, 104, 105, and 106 are arranged in an area where it is estimated that an external action is to be applied to the part or all of the output lines.

The RS latch circuit is constituted by the NAND circuits 101 and 102 and the output lines 103, 104, 105, and 106.

The attack detecting circuit 108 further includes an attack detecting unit 107 coupled to the output lines 105 and 106, and the attack detecting unit 107 detects an attack depending on a monitoring result of changes in output values B and C of the output lines 105 and 106.

The NAND circuits 101 and 102 may be used, or NOR circuits may be used instead. The attack detecting circuit may be used for an application of another circuit in common. For example, lines drawn out of the output lines 105 and 106 and the like may be coupled to another circuit.

An operation of the attack detecting circuit using the RS latch circuit illustrated in FIG. 1 is as follows.

When "0" is input as the input value A illustrated in FIG. 1, the output values B and C are both "1" and an output state becomes stable. For example, when the input value A is changed from "0" to "1," the output state becomes an unstable state, such as a state in which the output values B and C are always "0," a state in which the output values B and C are always "1," or a state in which the output values B and C are a random number which varies between "0" and "1," because element characteristics of the two NAND gates are not completely equal to each other and are slightly different from each other. This output state may be reproducible.

For example, it has been found by experiments that the output state always exhibits the same or similar behavior when the input value is changed from "0" to "1," but the output state is changed due to instability of the state when an external action (external force) is applied to the output lines 103, 104, 105, and 106.

Figure 2:
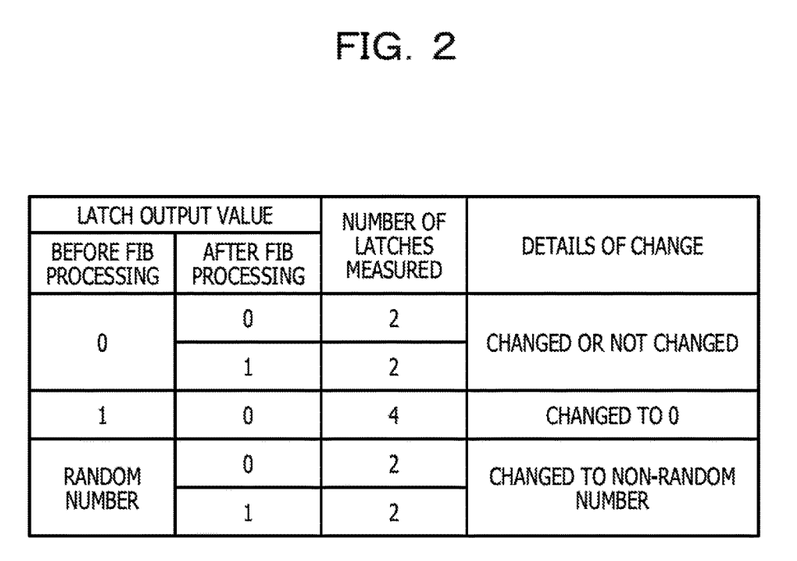
FIG. 2 is a view illustrating an example of an output value to an attack detecting unit before and after a focused ion beam (FIB) processing.

FIG. 2 illustrates an example of an output value to the attack detecting unit before and after an FIB processing. FIG. 2 is a table illustrating an output value of a latch circuit, the number of latches measured, and an experimental result of a change before and after the FIB processing. A change in the output when a hole is formed in the IC chip and an external action is applied to the output line in order to read the output of the latch circuit was verified. For example, four latch circuits of which the output value B was "0" when the input value was "1" before the FIB processing, four latch circuits of which the output value B was "1" when the input value was "1" before the FIB processing, and four latch circuits of which the output value B was a random number when the input value was "1" before the FIB processing are used as latch circuits which is used for an experiment. As a result, two latch circuits among the four latch circuits of which the output value B was "0" before the FIB processing had an output value of "0" after the FIB processing, and there is at least one latch circuit having an output value of "1" after the FIB processing out of the remaining two latch circuits. All the four latch circuits of which the output value B was "1" before the FIB processing had an output value which was changed to "0" after the FIB processing. Among the four latch circuits of which the output value was a random number before the FIB processing, two latch circuits had an output value B of "0" instead of a random number after the FIB processing, and the other two latch circuits had an output value of "1" instead of a random number after the FIB processing. From this verification result, it is confirmed that the output value may be changed before and after the FIB processing in which an external action is applied to the output lines.

The output lines 103, 104, 105, and 106 of the latch circuit illustrated in FIG. 1 are disposed to be located around an area in which a protection target component is arranged. By determining whether the states of the output values B and C are changed after the input value is switched to "1," an invasive attack in which an external action or the like is applied such as an FIB attack is detected.

In the latch circuits, there are some latch circuits of which the output value is not changed even when an external action is applied. Meanwhile, since there are also latch circuits of which the output value is changed from "1" to "0," the output value is changed from "0" to "1," or the output value is changed from a random number to a non-random number (such as a constant) when the external action is applied, an invasive attack is detected by the attack detecting unit 107 based on a change in state of the output value in some cases.

Figure 3:
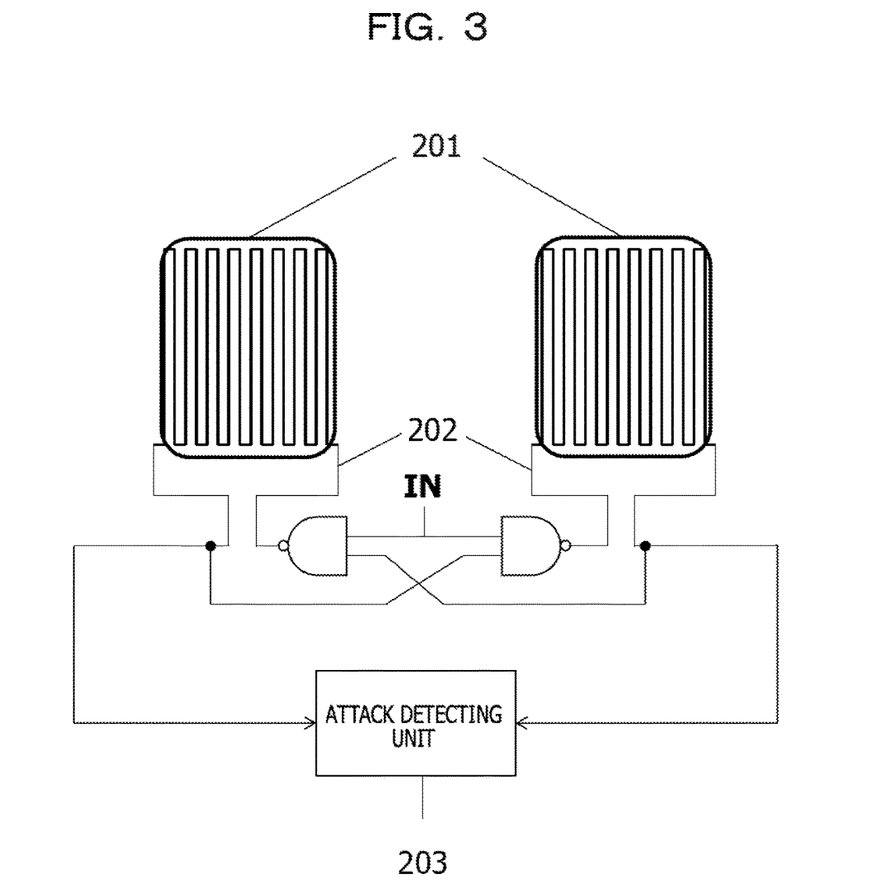
FIG. 3 is a diagram illustrating an example of the attack detecting circuit.

FIG. 3 illustrates an example of the attack detecting circuit. The attack detecting circuit illustrated in FIG. 3 includes output lines (external action detecting lines 202) of a latch circuit which are densely arranged in an external action detection area 201. For example, the external action detecting lines 202 may correspond to at least a part of the output lines 103, 104, 105, and 106 illustrated in FIG. 1.

In a detection target area of an external action, since the output lines of the latch circuit have a folded shape and/or a circular shape, the output lines may be widely spread over a component to be protected which is disposed below the detection target area of an external action to protect the component. When an invasive attack is made, an external action is applied to the output lines arranged in the detection target area of the external action and the output of the latch circuit is changed. Accordingly, an attack detecting unit 203 detects the output change and determines whether the external action is applied.

Figure 4:
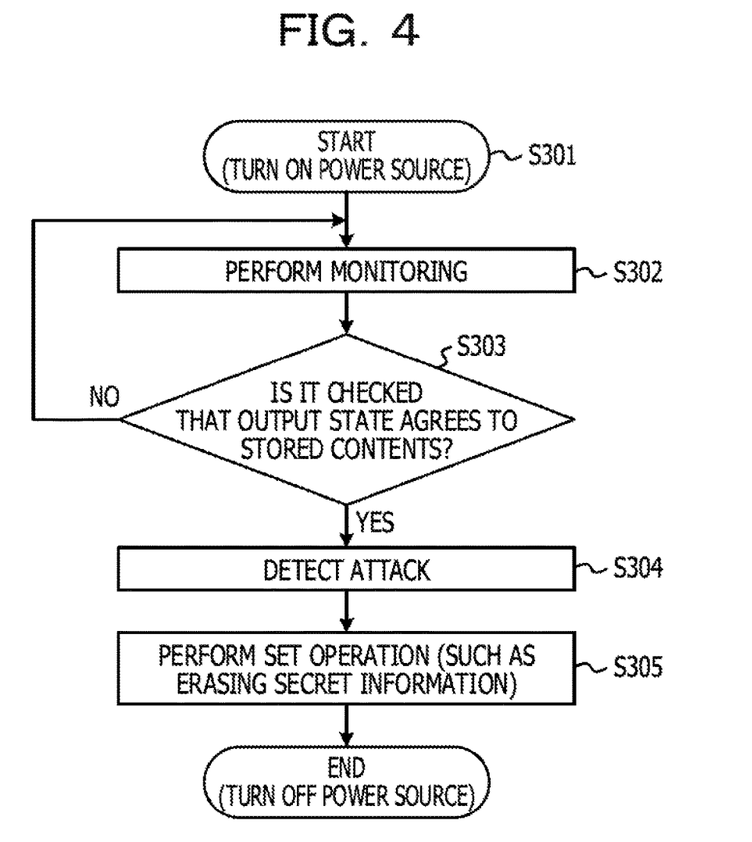
FIG. 4 is a diagram illustrating an example of an operation of detecting an attack in the attack detecting circuit.

FIG. 4 illustrates an example of an operation of detecting an attack in the attack detecting circuit.

A power source of an IC chip or the like on which the attack detecting circuit is mounted is turned on and, with the supply of power, an input value A is input from an input part (IN) illustrated in FIG. 3 (operation S301). An output value of the latch circuit corresponding to the input value A is input to the attack detecting unit. The attack detecting unit monitors the output value of the latch circuit (operation S302). The output state of the latch circuit which is determined based on the characteristics of the latch circuit at the time of manufacturing a chip in the attack detecting unit includes (1) always 0, (2) always 1, and (3) a random number. Which one out of the three output states the latch circuit has is stored. As stored information, the result which is determined by an input and output test may be stored or the monitored output under operation may be stored. When the power source of the IC chip becomes a turned-on state, the attack detecting unit determines whether the monitored output state of the latch circuit agrees to the output state at the time of manufacturing the chip or a previous output state (operation S303). Whether the output state of the latch circuit agrees may be determined by a comparison circuit, a software process, or the like. It is determined whether the state (for example, "0," "1," or "random number") of the output value of the latch circuit which is input to the attack detecting unit agrees to the stored contents (for example, "0," "1," or "random number"). When it is determined that the state of the output value agrees to the stored contents (NO in operation S303), it is determined that a physical attack is not made, and the process of monitoring the output state of the latch circuit is performed again (operation S302). When it is determined that the input value to the attack detecting circuit does not agree to the state of the stored value (YES in operation S303), the attack detecting circuit determines that an invasive attack is applied to the attack detecting circuit, and detects the attack (operation S304). After the attack is detected, the attack detecting circuit performs a set operation (operation S305). The set operation may be an operation for protecting data, for example, a process of causing secret information in the chip not to be read such as a process of erasing the secret information or causing the power source of the chip not to be turned on again. Accordingly, the leakage of the secret information may be reduced.

In order to raise the probability that the change in output due to an external action will be detected, the attack detecting unit may detect an attack based on the output states of plural latch circuits. For example, outputs of N latch circuits are input to the attack detecting unit. It may be determined that an attack is made when it is detected that the output states of M or more latch circuits out of the N latch circuits are different from the output states at the time of manufacturing, respectively.

Figure 5:
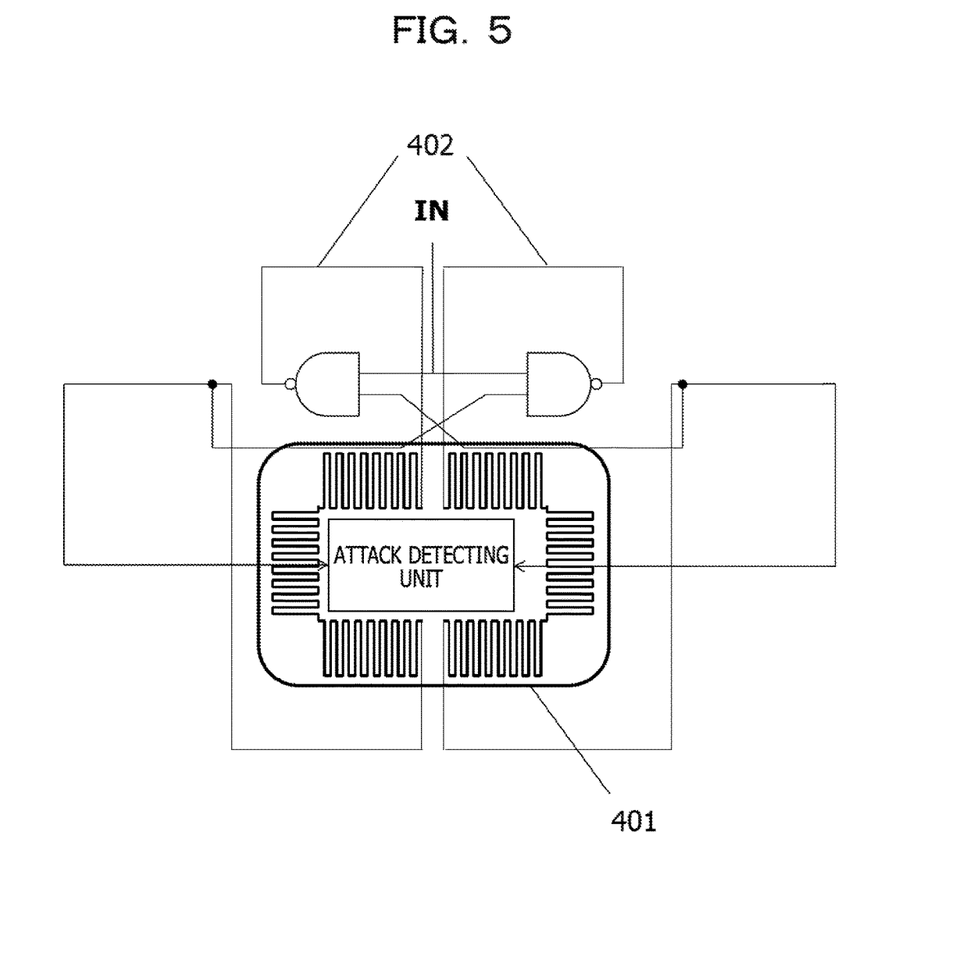
FIG. 5 is a diagram illustrating an example of the attack detecting circuit.

FIG. 5 illustrates an example of the attack detecting circuit.

In the attack detecting circuit illustrated in FIG. 5, the attack detecting unit is protected by an external action detecting line 402. For example, an attacker analyzes the output states of a latch circuit at the time of manufacturing the latch circuit, which are stored in the attack detecting unit. For example, by inputting the analyzed output states of the latch circuit at the time of manufacturing the latch circuit to the attack detecting unit, the attack detecting unit may not detect an attack.

For example, a protection circuit that protects the attack detecting unit illustrated in FIG. 5 is used. When the attacker analyzes the output states of the latch circuit at the time of manufacturing the latch circuit, which are stored in the attack detecting unit, the attack detecting unit may detect the attack and it may be difficult to analyze the output of the latch circuit.

Figure 6:
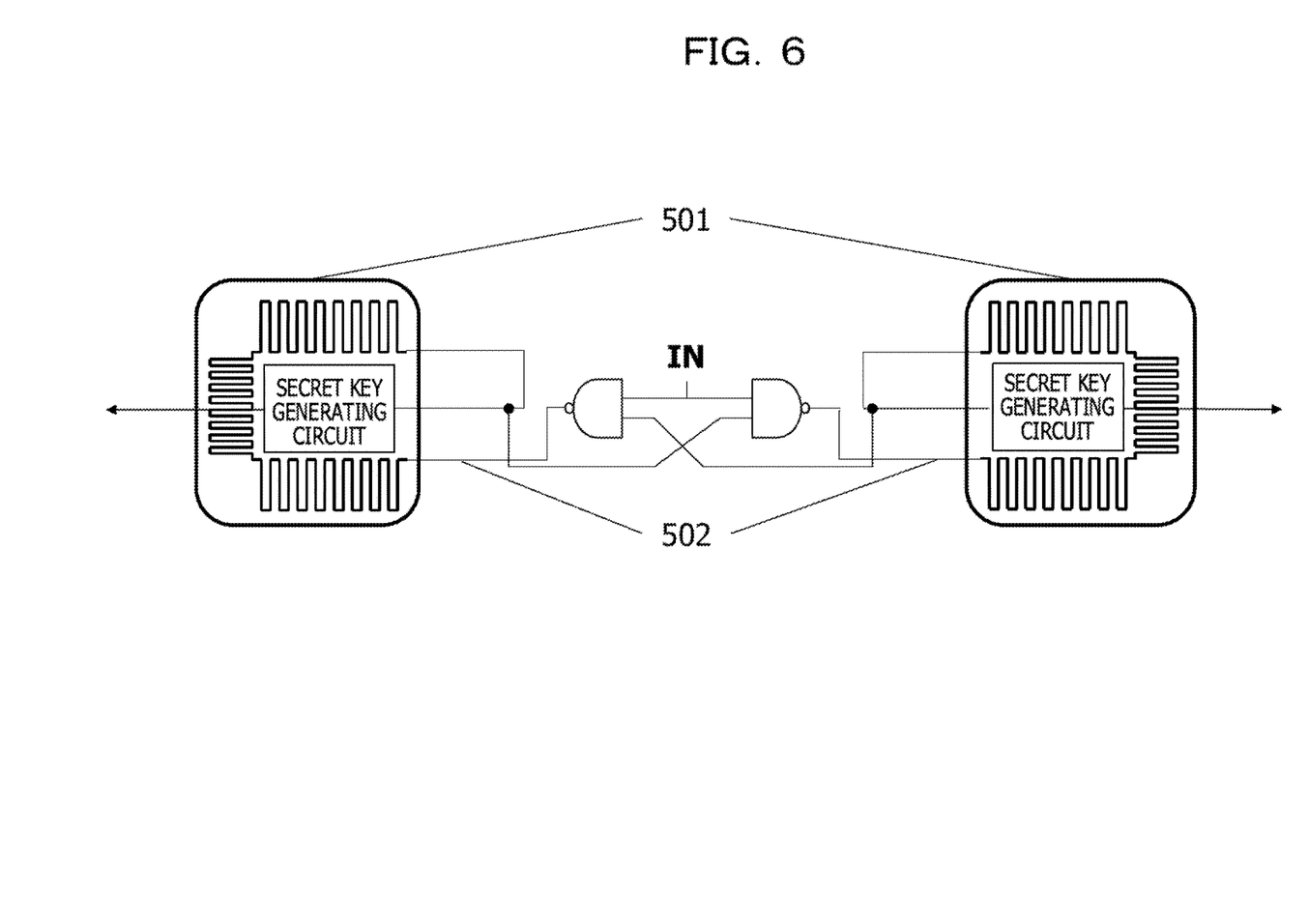
FIG. 6 is a diagram illustrating an example of a circuit.

FIG. 6 illustrates an example of a circuit.

In the circuit illustrated in FIG. 6, a secret key is generated based on the output of the latch circuit.

When the output value of the latch circuit is used for a particular application such as a secret key, a circuit for generating a secret key such as a flip-flop may be inserted into an output line of a NAND. In FIG. 6, an area 501 surrounding a secret key generating circuit is covered with an external action detecting line 502 of the latch circuit.

For example, when the output value of the latch circuit is used for a particular application, a secret key is generated and authentication is performed based on the output of the latch circuit. The authentication function may be used as attack detecting means. When a secret key is generated based on the output value of the latch circuit, the output of the latch circuit is changed due to an attacker's attack, and the generated secret key is changed based on the output value of the latch circuit. Accordingly, the authentication may fail and an access to the secret information may be not possible.

In FIG. 6, the leakage of the secret information due to an invasive attack may be reduced without using the attack detecting unit.

Figure 7:
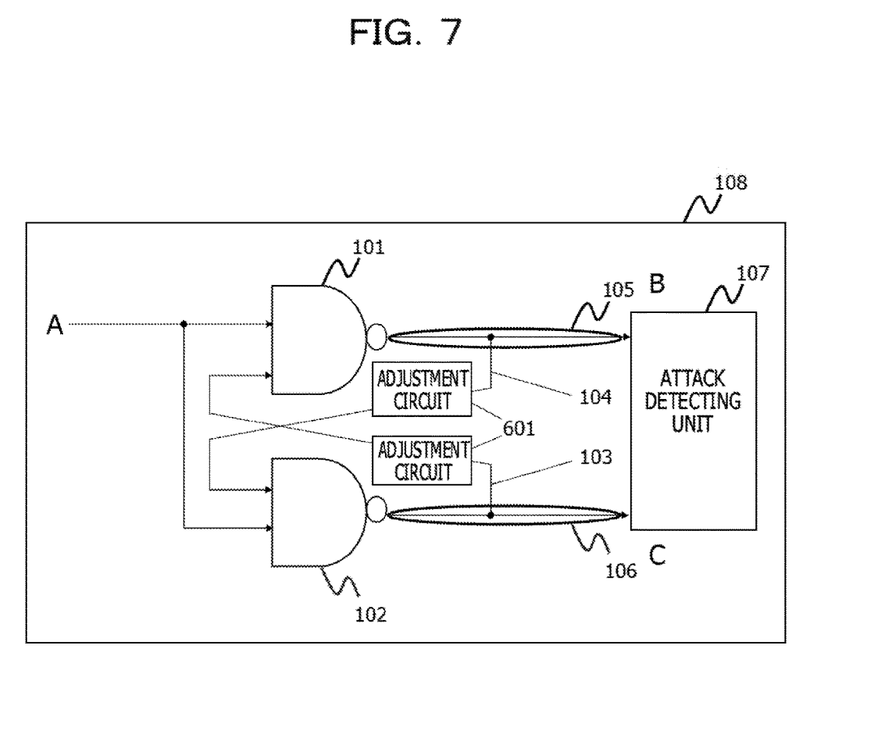
FIG. 7 is a diagram illustrating an example of the attack detecting circuit.

FIG. 7 illustrates an example of the attack detecting circuit. In FIG. 7, the output of the latch circuit before an external action is detected is adjusted to a random number.

As illustrated in FIG. 7, by disposing an adjustment circuit 601 in the output lines 103 and 104 of the attack detecting circuit 108, the output state of the latch circuit which is stored in the attack detecting unit is adjusted.

As illustrated in FIG. 2, when the output value before the FIB processing is "0," the output after the FIB processing is "0" with a probability of 50%, and the output after the FIB processing is "1" with a probability of 50%. Accordingly, when the output value before the FIB processing is "0," the probability that the change of the output value after the FIB processing will be detected is approximately 50% of that when the output value after the FIB processing is "1," and the probability of detection of an invasive attack is not high. When the output value before the FIB processing is "1," all the output values after the FIB processing are "0." Accordingly, when the output value before the FIB processing is "1," it may be considered that most of the output values after the FIB processing is "0," and the change may be predicted. When the output value before the FIB processing is a random number, the output value after the FIB processing is not a random number but "0" with a probability of 50% and "1" with a probability of 50%. Accordingly, when the output value before the FIB processing is a random number, there is a high possibility that the output value after the FIB processing will be a non-random number (a constant). The output value after the FIB processing has two types of "0" and "1" and thus an attacker has a difficulty in predicting a change after the FIB processing. Accordingly, when the output value before the FIB processing is a random number, the possibility that an invasive attack will be detected by the attack detecting circuit may be higher and stability also may be higher, in comparison with a case in which the output value before the FIB processing is "0" or "1."

Based on the above-mentioned result, in order to set the output value of the latch circuit before the FIB processing to be a random number, the adjustment circuit 601 is added to the latch circuit to adjust the input signal. As a method of adjusting the output state of the latch circuit to a random number, a method of changing a clock signal input to the latch circuit to another clock signal of a different frequency and fixing the frequency of a signal input to the RS latch circuit when the output of the latch circuit is changed to a random number may be used.

Figure 8:
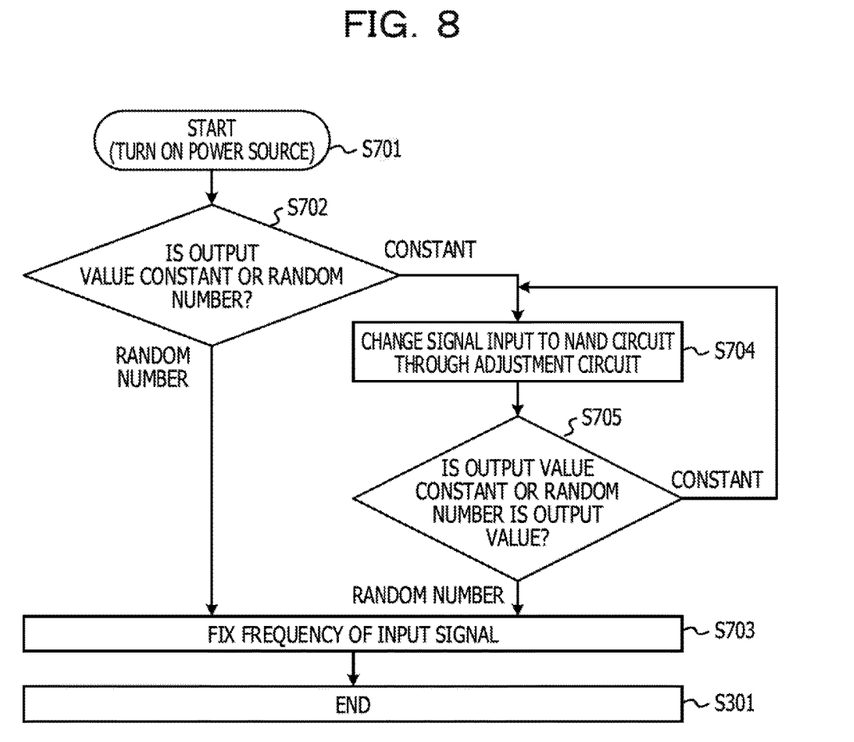
FIG. 8 is a diagram illustrating an exemplary process of adjusting an output to a random number.

FIG. 8 illustrates an example of a process of adjusting the output to a random number in the adjustment circuit.

A power source of an IC chip or the like on which the attack detecting circuit is mounted is turned on (operation S701). With the supply of power, as illustrated in FIG. 7, an input value A is input and the output value of the latch circuit based on the input value A is input to the adjustment circuit. The adjustment circuit determines whether the output value of the latch circuit is a constant or a random number (operation S702). When the output value of the latch circuit is a random number, the frequency of an input signal input to the NAND circuit (input from the output lines 103 and 104) through the adjustment circuit is fixed (operation S703) and the process flow ends. When the output value of the latch circuit is a constant, the frequency of the input signal input to the NAND circuit through the adjustment circuit is changed again (operation S704). It is determined whether the output value of the latch circuit is a constant or a random number (operation S705). When the output value of the latch circuit is changed from a constant to a random number, the frequency of the input signal input to the NAND circuit through the adjustment circuit is fixed (operation S704) and the process flow ends. When the output value is a constant, the frequency of the input signal input to the NAND circuit through the adjustment circuit is changed again (operation S705). The frequency of the input signal is changed until the output value is changed to a random number.

As a method of adjusting the output value of the latch circuit to a random number, a delay time in the adjustment circuit may be changed.

Through the above-mentioned processes, the latch circuit mounted on a chip may be adjusted to a latch circuit that outputs a random number to construct a protection circuit having higher stability.

The adjustment circuit illustrated in FIG. 7 may be added to the configurations illustrated in FIGS. 3, 5, and 6.

The adjustment circuit may be protected by the attack detecting circuit such that an attacker cannot make an attack on the adjustment circuit. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to an illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. An electronic circuit comprising:
a first logic circuit coupled to a first input line and a first output line;
a second logic circuit coupled to a second input line and a second output line;
a first line pattern including a third input line which is coupled to the first output line, inputs to the second logic circuit as an input line different from the second input line and includes a first folded part corresponding to at least three folded portions; and
a second line pattern including a forth input line which is coupled to the second output line, inputs to the first logic circuit as an input line different from the first input line and includes a second folded part corresponding to at least three folded portions,
wherein at least a part of the first output line or the second output line has a folded shape part which is different from the first folded part and the second folded part.

2. The electronic circuit according to claim 1, wherein the first logic circuit and the second logic circuit are one of a NAND circuit and a NOR circuit.

3. The electronic circuit according to claim 1, wherein a line pattern having the folded shape part extends to a detection target area of an external action.

4. The electronic circuit according to claim 1, wherein output information of the electronic circuit is secret information, and
a line pattern having the folded shape part extends to an output reading area for the output information.

5. The electronic circuit according to claim 1, further comprising:
an adjustment circuit configured to set a random number to outputs of the first logic circuit and the second logic circuit.

6. A latch circuit comprising:
a first logic circuit coupled to a first input line and a first output line;
a second logic circuit coupled to a second input line and a second output line;
a first line pattern including a third input line which is coupled to the first output line, inputs to the second logic circuit as an input line different from the second input line and includes a first folded part corresponding to at least three folded portions; and
a second line pattern including a forth input line which is coupled to the second output line, inputs to the first logic circuit as an input line an input line different from the first input line and includes a second folded part corresponding to at least three folded portions,
wherein at least one of the first output line and the second output line has a folded shape part which is different from the first folded part and the second folded part and extends to a detection target area of an external action, and
an application of an external action on the detection target area of the external action is notified based on a change in an output of one of the first output line, the first line pattern, the second output line, and the second line pattern.

7. The latch circuit according to claim 6, wherein the first logic circuit and the second logic circuit are one of a NAND circuit and a NOR circuit.

8. The latch circuit according to claim 6, wherein a determination area that determines whether the external action is applied corresponds to the detection target area of the external action.

9. The latch circuit according to claim 6, wherein output information of the latch circuit is secret information, and
an output reading area for the output information corresponds to the detection target area of the external action.

10. The latch circuit according to claim 6, further comprising a circuit configured to:
determine whether an output before an external action is detected in the latch circuit is a constant or a random number;
select whether a clock signal input to the latch circuit is to be maintained or changed to another clock signal having a different frequency based on a determination result;
fix the frequency of the clock signal input when the output of the latch circuit is a random number in response to the changed clock signal; and
adjust the random number.

11. The latch circuit according to claim 6, further comprising a circuit configured to:
determine whether the output before an external action is detected in the latch circuit is a constant or a random number;
delay a clock signal input to the latch circuit based on a determination result;
fix the frequency of the delayed clock signal when the output of the latch circuit is a random number in response to the delayed clock signal; and
adjust the random number.

12. The latch circuit according to claim 6, wherein at least a part of lines in the latch circuit has a folded shape.

13. An external action detecting circuit comprising:
a latch circuit including an output line; and
an attack detector configured to detect an attack based on a change in an output value when an external action is applied to the output line,
wherein the output line is disposed in an external action detection area,
wherein the latch circuit includes:
a first logic circuit coupled to a first input line and a first output line;
a second logic circuit coupled to a second input line and a second output line;
a first line pattern including a third input line which is coupled to the first output line, inputs to the second logic circuit as an input line different from the second input line and includes a first folded part corresponding to at least three folded portions; and
a second line pattern including a forth input line which is coupled to the second output line, inputs to the first logic circuit as an input line an input line different from the first input line and includes a second folded part corresponding to at least three folded portions,
wherein at least one of the first output line and the second output line has a folded shape part which is different from the first folded part and the second folded part and extends to a detection target area of an external action.

* * * * *